United States Patent [19]
George

[11] Patent Number: 5,798,668
[45] Date of Patent: Aug. 25, 1998

[54] LOW-POWER TRANSCONDUCTANCE DRIVER AMPLIFIER

[75] Inventor: John Barrett George, Carmel, Ind.

[73] Assignee: Thomson Consumer Electronics, Inc., Indianapolis, Ind.

[21] Appl. No.: 563,528

[22] Filed: Nov. 28, 1995

[51] Int. Cl.⁶ .................................................. G05F 1/10
[52] U.S. Cl. ................................................ 327/538; 327/108
[58] Field of Search ................................. 327/538–543, 327/77, 87, 427, 478, 108–112, 483, 50, 51, 574, 581, 575

[56] References Cited

U.S. PATENT DOCUMENTS

| | | | |
|---|---|---|---|
| 3,859,557 | 1/1975 | Grant et al. | 315/27 TD |
| 4,289,994 | 9/1981 | Beaumont et al. | 315/371 |
| 4,472,687 | 9/1984 | Kashiwagi et al. | 330/297 |
| 4,484,111 | 11/1984 | McMorrow, Jr. et al. | 315/397 |
| 4,520,322 | 5/1985 | Ishii | 330/263 |
| 4,961,032 | 10/1990 | Rodriguez-Cavazos | 315/397 |
| 5,027,004 | 6/1991 | Palara | 327/109 |
| 5,091,664 | 2/1992 | Furuhata | 327/584 |
| 5,113,305 | 5/1992 | Raciti et al. | 327/109 |
| 5,500,619 | 3/1996 | Miyasaka | 327/427 |

FOREIGN PATENT DOCUMENTS

| | | | |
|---|---|---|---|
| 0 618 673 A2 | 10/1994 | European Pat. Off. | H03F 1/02 |
| 0 618 673 A3 | 12/1995 | European Pat. Off. | H03F 1/02 |
| 56-168406A | 12/1981 | Japan | H03F 1/02 |

OTHER PUBLICATIONS

Steele, et al., "Tame Deflection Circuits With Power Boosters", published in the USA in *Electronic Design*, vol. 37, No. 20, Sep. 28, 1989.

*Primary Examiner*—Toan Tran
*Attorney, Agent, or Firm*—Joseph S. Tripoli; Joseph J. Laks; Marion P. Metelski

[57] ABSTRACT

A convergence correction voltage waveform is applied to a power amplifier circuit. An output stage of the power amplifier drives a deflection coil of a cathode ray tube with a convergence correction current, which is proportional to the convergence correction voltage waveform. A differential voltage potential across an output device of the output stage is compared against a predetermined reference voltage. As the differential voltage potential begins to drop below the predetermined reference voltage, a buck-topology voltage regulator, which is coupled to the output device, turns on. The differential voltage potential is thereby maintained at a level greater than the predetermined reference voltage.

12 Claims, 5 Drawing Sheets

LOW-POWER TRANSCONDUCTANCE DRIVER AMPLIFIER

BACKGROUND OF THE INVENTION

1. Field of the Invention

This invention relates generally to the field of amplifier circuits, and, in particular, to power amplifiers for driving deflection coils in, for example, convergence yokes of cathode ray tubes.

2. Description of Prior Art

Cathode ray tubes (CRTs) used in television receivers are subject to distortions of the video image on the CRT's faceplate raster. These distortions may include pincushion distortion, barrel distortion, trapezoidal distortion, horizontal non-linearity and vertical non-linearity.

A projection television receiver comprises three CRTs, which may be positioned in an off-axis orientation with respect to one another, and two of the three CRTs may be positioned in an off-axis orientation with respect to a projection screen. This alignment of the CRTs with respect to each other and with respect to the projection screen magnifies onto the projection screen those distortions of the video image already present at the CRT's faceplate raster. In addition, this alignment also introduces further distortions of its own into the video image on the projection screen, including horizontal and vertical trapezoidal distortion, skew distortion and bow distortion. The distortions present for each of the three colors are different because the orientation of each CRT with respect to the projection screen is different.

In order to correct these distortions, projection television receivers are normally provided with an auxiliary deflection yoke for each of the three CRTs. These auxiliary deflection yokes are commonly referred to as convergence yokes. Each of the three CRTs requires a horizontal deflection coil and a vertical deflection coil in its convergence yoke, for a total of six deflection coils in a convergence yoke system.

The deflection coils of the convergence yokes are necessarily excited with current waveforms which are appropriate for correcting the video image that is present on the projection screen. Such waveforms are often generated as combinations of vertical-rate and horizontal-rate parabolas, ramps and DC levels, and as the product of such parabolas, ramps and DC levels.

Each of the six convergence yoke coils is driven by a separate power amplifier because the amplitudes and shapes of the current waveforms needed to excite the six deflection coils may be different from one another. Each of the power amplifiers takes as an input voltage a low-voltage waveform generated by a convergence waveform generator and produces as an output to the corresponding deflection coil a current, which is proportional to such voltage and is of sufficient power to drive the coil.

One possible implementation of a power amplifier used for driving deflection coils in the convergence yokes of cathode ray tubes is described in U.S. Pat. No. 4,961,032 to E. Rodriguez-Cavazos, and is shown in FIG. 5. This power amplifier uses two different power supplies during distinctly different portions of a deflection coil's current waveform. For example, during a positive excursion of an input voltage waveform, which is provided by a waveform generator 8, a low-voltage level $+V_{LOW}$ is used during a trace portion of the deflection coil's current waveform, when the necessary driving voltage for the deflection coil is relatively low. A high-voltage level $+V_{HIGH}$, which is responsive to sense circuit 22, is available during the retrace portion of the current waveform, when a rapid change in the current flowing through the deflection coil dictates a high driving voltage for the deflection coil. During a negative excursion of the convergence correction waveform, voltage levels $-V_{LOW}$ and $-V_{HIGH}$ are used. By using a different power supply for each of the two distinct portions of the deflection coils' current waveform, the power dissipated in the convergence amplifiers is reduced. This, in turn, allows for the use of smaller heat sink areas for the convergence amplifiers' output devices, and it eases the convergence amplifiers' power supply requirements.

It is desirable to reduce further the power dissipated in the convergence amplifiers. In particular, it is advantageous to minimize the power dissipated in the convergence amplifiers' output devices.

SUMMARY OF THE INVENTION

In a power amplifier according to the inventive arrangements taught herein, a differential voltage potential across an output device remains minimized while the output device conducts a current, despite variations in an output voltage.

Such an amplifier circuit comprises: an output stage for generating an output current for driving a high-frequency load; and, a first terminal of the output stage tracking a voltage at a second terminal of the output stage, so that a differential voltage potential is maintained between the first and second terminals.

The differential voltage potential may be greater in magnitude than a predetermined voltage potential.

According to a feature of the inventive arrangement taught herein, an amplifier circuit comprises: a semiconductor output device for generating an output current for driving a high-frequency load, the output device having first and second electrodes, the second electrode coupled to the load; and, means for maintaining a differential voltage potential between the first and second electrodes which is greater in magnitude than a predetermined voltage potential despite variations in a voltage at the second electrode of the output device.

The maintaining means may comprise: means for comparing the differential voltage potential with the predetermined voltage potential; a capacitor; and, means for charging the capacitor responsive to the comparing means.

The comparing means may cause the charging means to charge the capacitor when the differential voltage potential decreases in magnitude below the predetermined voltage potential. The comparing means may conduct a constant current regardless of variations in the voltage at the second electrode of the output device when the differential potential is greater in magnitude than the predetermined voltage potential.

A voltage across the capacitor may be equal in magnitude to approximately a sum of the voltage at the load and the differential voltage potential. The differential voltage potential may comprise a sum of the predetermined voltage potential and an overshoot voltage, the magnitude of which is dependent upon a switching speed of the switch device. The differential voltage potential is maintained even as a voltage at the load reverses polarity.

The charging means may comprise: a switch device having a first electrode coupled to a first source of voltage potential; an inductor having a first terminal coupled to a second electrode of the switch device and a second terminal coupled to a first terminal of the capacitor; and, a diode coupled between the first terminal of the inductor and a second source of voltage potential, such that the diode becomes forward-biased when the switch device is rendered non-conductive.

The switch device may comprise first and second bipolar junction transistors arranged in a Darlington configuration, and both of these transistors may turn off approximately simultaneously when the differential voltage potential is greater in magnitude than the predetermined voltage potential. A Schottky diode may be coupled from the first transistor (Q53 or Q54) to the second transistor.

According to a further feature of the inventive arrangement taught herein, an amplifier circuit comprises: a semiconductor output device for generating an output current for driving a load; means for comparing a differential voltage potential between first and second electrodes of the output device with a predetermined voltage potential; and, a switched-mode voltage regulator coupled to the output device and responsive to the comparing means.

The switched-mode voltage regulator may maintain the differential voltage potential at a level which is greater in magnitude than the predetermined voltage potential despite variations in a voltage at the second electrode of the output device. The differential voltage potential may comprise a sum of the predetermined voltage potential and an overshoot voltage, the magnitude of which is dependent on a speed with which the switched-mode voltage regulator is responsive to the comparing means.

A switch device of the switched-mode voltage regulator may switch at a frequency determined by the load.

The comparing means may cause the switched-mode voltage regulator to discontinue conducting when the differential voltage potential equals or exceeds in magnitude the predetermined voltage potential.

The above, and other features and advantages of the present invention, will become apparent from the following description read in conjunction with the accompanying drawings, in which like reference numerals designate the same elements.

DETAILED DESCRIPTION OF THE PREFERRED EMBODIMENTS

Figure 1:
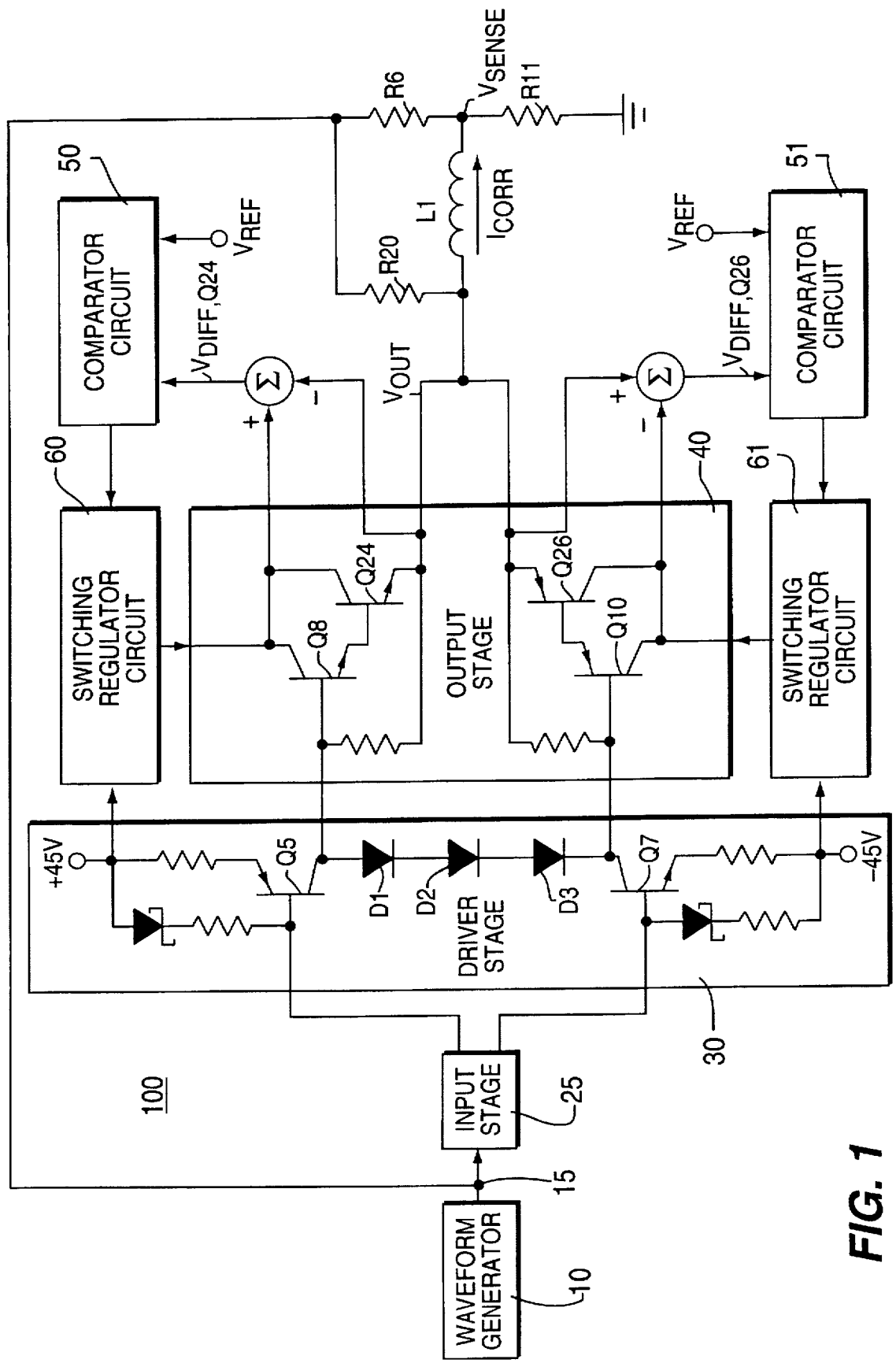
FIG. 1 is a diagram, in block and schematic form, of an amplifier circuit according to an inventive arrangement taught herein.
Figure 2:
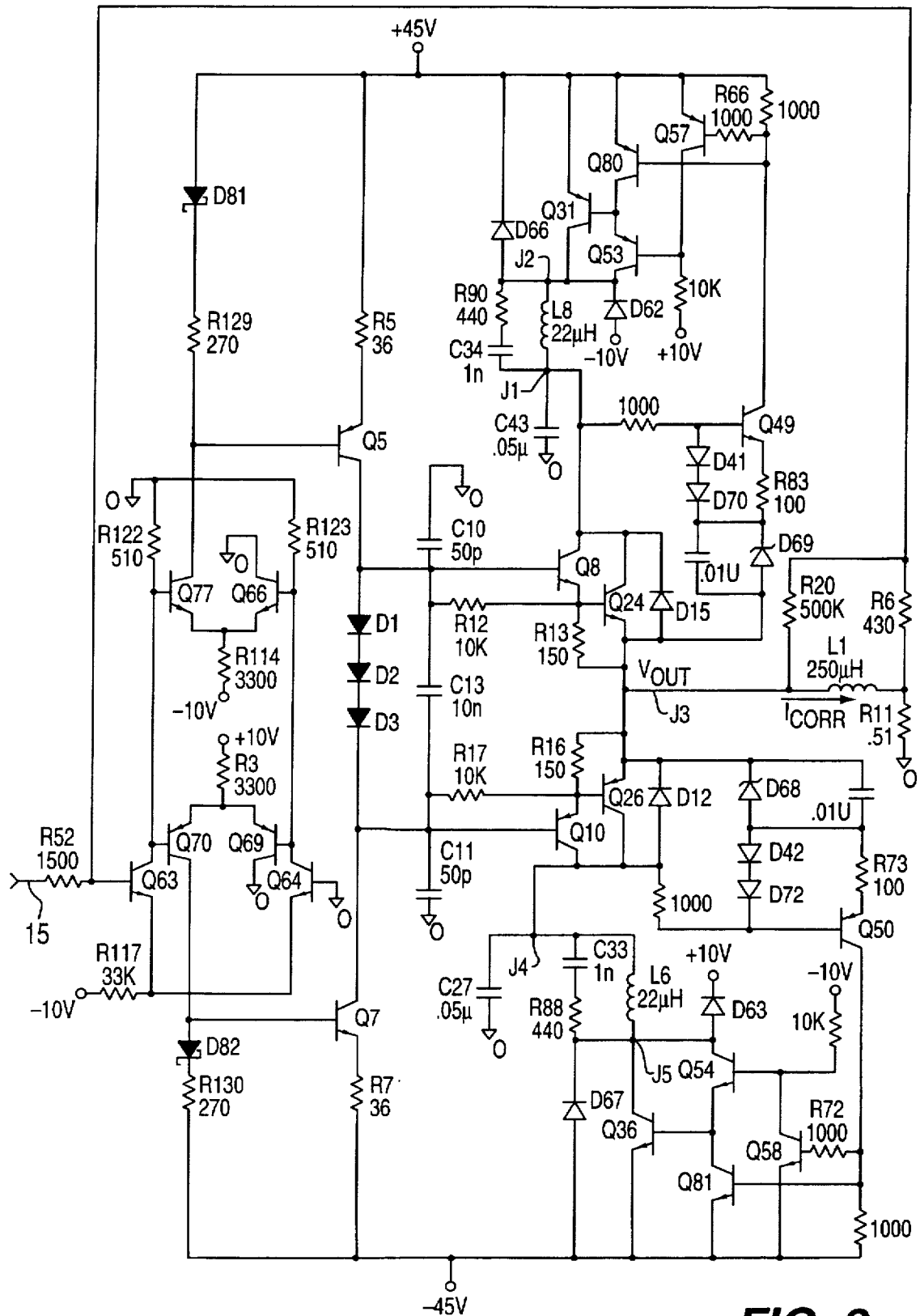
FIG. 2 is a schematic diagram of an embodiment of the amplifier circuit shown in FIG. 1.

A power amplifier 100, shown in FIGS. 1 and 2, may be used to drive a deflection coil L1, for example, in a convergence yoke of a cathode ray tube (not shown).

Referring to FIG. 1, a waveform generator 10 provides a convergence correction voltage waveform 15 to an input stage 25. Waveform generator 10 may be of a conventional design, and is not discussed herein. Input stage 25 drives transistors Q5 and Q7 of a driver stage 30. Transistors Q5 and Q7 of driver stage 30, in turn, drive output devices Q8, Q24 and Q10, Q26, respectively, of output stage 40. Output devices Q8, Q24 and Q10, Q26 ultimately drive deflection coil L1 with a convergence correction current $I_{CORR}$, which is proportional to convergence correction voltage waveform 15. A sense voltage $V_{SENSE}$ develops as convergence correction current $I_{CORR}$ flows through current sense resistor R11. The sense voltage $V_{SENSE}$ is fed back to the input stage 25 by resistor R6. Resistor R20 controls ringing at deflection coil L1 by limiting a high-frequency gain of power amplifier 100.

Comparator circuits 50 and 51 measure differential voltage potentials $V_{DIFF.Q24}$ and $V_{DIFF.Q26}$ across output devices Q8, Q24 and Q10, Q26, respectively. Switching regulator circuits 60 and 61 adjust differential voltage potentials $V_{DIFF.Q24}$ and $V_{DIFF.Q26}$, respectively, such that the magnitude of each differential voltage potential is greater than a predetermined reference voltage $V_{REF}$.

A detailed schematic diagram of amplifier 100 is shown in FIG. 2. Amplifier 100 has first and second sources of voltage potential, +10 V and −10 V, respectively; third and fourth sources of voltage potential, +45 V and −45 V, respectively; and a source of reference potential, for example ground. One skilled in the art may vary the levels of these sources of voltage potential according to circuit, signal and load requirements.

Input stage 25 may generally comprise transistors Q63, Q64, Q66, Q69, Q70 and Q77. Transistors Q63 and Q64 may, for example, have an industry part number BC548C. Transistors Q69 and Q70 may, for example, have an industry part number BC556B.

Transistors Q66 and Q77 may, for example, have an industry part number BC546B.

Driver stage 30 may generally comprise first and second current amplifier circuits. A first current amplifier circuit may generally comprise transistor Q5, resistors R5 and R129, and diode D81. The first current amplifier circuit may have input and output terminals at base and collector electrodes, respectively, of transistor Q5. A second current amplifier circuit may generally comprise transistor Q7, resistors R7 and R130, and diode D82. The second current amplifier circuit may have input and output terminals at base and collector electrodes, respectively, of transistor Q7. Transistors Q5 and Q7 may, for example, have industry part numbers MPSA92 and MPSA42, respectively. Diodes D81 and D82 may comprise Schottky diodes, as indicated in FIG. 2, and may, for example, have an industry part number 1N5817.

Output stage 40 may generally comprise Darlington-pair output devices Q8, Q24 and Q10, Q26. Transistors Q8 and Q24, diode D15 and resistors R12 and R13 may, for example, comprise a composite device which has an industry part number BDW93/CFI and is manufactured by SGS Thomson Microelectronics. Transistors Q10 and Q26, diode D12 and resistors R16 and R17 may, for example, comprise a composite device which has an industry part number BDW94/CFI and is manufactured by SGS Thomson Microelectronics.

Capacitors C10, C11 and C13 minimize turn-on bias currents which flow into the base electrodes of transistors Q8 and Q10. The bias currents are caused by voltage variations which are generated at junctions J1 and J4 by the action of switching regulator circuits 60 and 61, respectively, and which are coupled from junctions J1 and J4 to the base electrodes of transistors Q8 and Q10 by the transistors' respective Miller effect capacitances.

Output devices Q8, Q24 and Q10, Q26 each typically require a bias voltage of approximately 1 V in order to turn on. Specifically, the base electrode of transistor Q8 must be approximately 1 V above the emitter electrode of transistor Q24 and the base electrode of transistor Q10 must be approximately 1 V below the emitter electrode of transistor Q26. Since the emitter electrodes of transistors Q24 and Q26 are coupled together, a voltage drop of approximately 2 V must exist from the base electrode of transistor Q8 to the base electrode of transistor Q10 in order for both Darlington-pair output devices to be biased on. In a presently preferred embodiment, a voltage drop of slightly less than 2 V is furnished by diodes D1, D2 and D3.

Biasing output devices Q8, Q24 and Q10, Q26 in this fashion places them on the threshold of turning on while preventing an undesired common-mode current. It also permits output devices Q8, Q24 and Q10, Q26 to respond rapidly to rapid changes in convergence correction voltage waveform 15 while minimizing a "dead zone" at the output devices' switchover point.

Comparator circuit 50, operatively associated with output device Q8, Q24, may generally comprise a voltage regulator D69, a transistor Q49, a resistor R83 and diodes D41 and D70. Voltage regulator D69 may comprise, for example, a Zener diode rated at 5.1 V and having an industry part number 1N5231. Transistor Q49 may, for example, have an industry part number MPSA42.

Comparator circuit 51, operatively associated with output device Q10, Q26, may generally comprise a voltage regulator D68, a transistor Q50, a resistor R73 and diodes D42 and D72. Voltage regulator D68 may comprise, for example, a Zener diode rated at 5.1 V and having an industry part number 1N5231. Transistor Q50 may, for example, have an industry part number MPSA92.

Switching regulator circuit 60, operatively associated with output device Q8, Q24 and comparator circuit 50, may generally comprise a buck-topology regulator circuit having transistors Q57 and Q80; a Darlington-pair switch device Q53, Q31; diodes D62 and D66; inductor L8; capacitor C43; and a snubber circuit comprising resistor R90 and capacitor C34. Transistor Q53 may, for example, have an industry part number MPSA92. Transistors Q57 and Q80 may, for example, have an industry part number BC556B. Transistor Q31 may, for example, have an industry part number MJE5195. Diodes D62 and D66 may, for example, have an industry part number MUR160.

Switching regulator circuit 61, operatively associated with output device Q10, Q26 and comparator circuit 51, may generally comprise a buck-topology regulator circuit having transistors Q58 and Q81; a switch device Q54, Q36; diodes D63 and D67; inductor L6; capacitor C27; and a snubber circuit comprising resistor R88 and capacitor C33. Transistors Q36 and Q54 may, for example, have industry part numbers TIP41C and MPSA42, respectively. Transistors Q58 and Q81 may, for example, have an industry part number BC546B. Diodes D63 and D67 may, for example, have an industry part number MUR160.

In operation, convergence correction voltage waveform 15 is coupled to input stage 25 at the base electrode of transistor Q63 by resistor R52. Transistors Q63 and Q64 and resistors R117, R122 and R123 form an inverting differential amplifier, which provides a voltage gain in order to minimize an input offset voltage. The outputs of the differential amplifier are taken at the collector electrodes of transistors Q63 and Q64. The voltages at the collector electrodes of transistors Q63 and Q64 are less than the voltages at the base electrodes of transistors Q63 and Q64, respectively. This allows the collector electrodes of transistors Q63 and Q64 to be coupled by resistors R122 and R123, respectively, to ground, thereby minimizing current flow within the inverting differential amplifier.

The inverting amplifier drives two current-steering devices, which are coupled between the collector electrodes of transistors Q63 and Q64. A first current-steering device is formed by transistors Q69 and Q70 and resistor R3, and a second current-steering device is formed by transistors Q66 and Q77 and resistor R114.

In a balanced condition, convergence correction voltage waveform 15 has an amplitude of zero volts, and a constant current flowing through resistor R117 is divided equally between resistors R122 and R123. Similarly, a current flowing through resistor R114 is conducted equally by transistors Q66 and Q77, and a current flowing through resistor R3 is conducted equally by transistors Q69 and Q70.

Input stage 25 is specifically designed so that the currents conducted by transistors Q77 and Q70 in a balanced condition are just enough to cause transistors Q5 and Q7, respectively, of driver stage 40 to just barely turn on. Thus, in a balanced condition, a common-mode current equal to, approximately, between 1 and 2 mA flows from the third source of voltage potential, +45 V, to the fourth source of voltage potential, −45 V, through transistor Q5, diodes D1, D2 and D3, and transistor Q7. This arrangement enables transistors Q5 and Q7 to respond rapidly to changes in convergence correction voltage waveform 15.

During a negative-polarity component of convergence correction voltage waveform 15, transistor Q63 becomes less conductive, so that the current flowing through resistor R122 decreases. Since the current through resistor R117 remains constant, the current flowing through resistor R123 necessarily increases by an amount that is equal and opposite to the decrease in current through resistor R122.

Concurrently, transistors Q66 and Q70 become less conductive. The increased current flowing through resistor R123 causes a voltage at the base electrodes of transistors Q66 and Q69 to become more negative, thereby causing transistor Q66 to become less conductive. Similarly, the decreased current flowing through resistor R122 causes a voltage at the base electrodes of transistors Q70 and Q77 to become more positive, thereby causing transistor Q70 to become less conductive.

Transistors Q69 and Q77, on the other hand, become more conductive. As transistor Q77 becomes more conductive, it draws more current from the base electrode of transistor Q5, thereby turning on transistor Q5 more fully. Simultaneously, as transistor Q69 becomes more conductive, transistor Q70 supplies less current to the base electrode of transistor Q7, thereby turning off transistor Q7.

Resistors R5 and R129 are chosen such that transistor Q5 conducts a current that is approximately equal to twelve times the current conducted by transistor Q77. The low forward voltage drop of diode D81 allows transistor Q5 to be barely on while input stage 25 is in a balanced condition. Diode D81 also provides temperature compensation by tracking, over temperature, the emitter-to-base voltage drop of transistor Q5 in order to protect transistor Q5 from the effects of thermal runaway.

The current conducted by transistor Q5 drives output device Q8, Q24 of output stage 40. As output device Q8, Q24 begins to conduct, the convergence correction current $I_{CORR}$, which is supplied by capacitor C43, flows through transistor Q24 and into the deflection coil L1.

As capacitor C43 supplies convergence correction current $I_{CORR}$ to deflection coil L1, a voltage at junction J1 begins to drop. Once this voltage drops sufficiently that differential voltage potential $V_{DIFF,Q24}$ falls below reference voltage $V_{REF}$, diodes D41, D69 and D70 are reverse biased and transistors Q49 and Q57 are turned off. Switching regulator circuit 60 is thus free to positively charge capacitor C43, thereby restoring differential voltage potential $V_{DIFF,Q24}$ to a level that is at least equal to reference voltage $V_{REF}$.

A critical concern in the choice of a value for the reference voltage $V_{REF}$ is the speed with which switching regulator circuits 60 and 61 can respond to the voltage requirements at junctions J1 and J4, respectively, as convergence correction current $I_{CORR}$ flows through deflection coil L1. In a typical convergence correction circuit, switching regulator circuits 60 and 61 may be required, for example, to conduct a current on the order of several Amperes for capacitors C43 and C27 within, for example, 5 or 6 μsec. In this regard it may be advantageous for reference voltage $V_{REF}$ to be as high as possible. At the same time, voltage reference $V_{REF}$ should be kept to a minimum so that power dissipated by output devices Q8, Q24 and Q10, Q26 is minimized. This tradeoff between the bandwidth of switching regulator circuits 60 and 61 and the power dissipation of output devices Q8, Q24 and Q10, Q26 establishes the framework within which a satisfactory value for reference voltage $V_{REF}$ is chosen. One skilled in the art can weigh these two factors to determine an acceptable value for reference voltage $V_{REF}$. In a presently preferred embodiment, a satisfactory value for $V_{REF}$ was empirically determined to be 8 V.

With transistor Q57 in an off state, switch device Q53, Q31 can turn on. Inductor L8 is coupled to the third source of voltage potential by transistor Q31. A positive charging current can thus begin to flow through transistor Q31. In order to avoid the current lag inherently associated with inductor L8, this charging current initially flows through the snubber circuit comprising resistor R90 and capacitor C34 until it can begin to charge capacitor C43 directly through inductor L8.

Once the voltage at junction J1 reaches the point that differential voltage potential $V_{DIFF,Q24}$ is equal to reference voltage $V_{REF}$, diodes D41 and D70 become forward biased and voltage regulator D69 maintains an essentially constant voltage drop of approximately 7.5 V from its cathode to its anode. As a result, transistor Q49 turns on.

The current that flows through transistor Q49 is limited by diodes D41 and D70. The voltage across resistor R83 is equal to the voltage drop across diodes D41 and D70 less the voltage drop across the base-emitter junction of transistor Q49. Thus, in a presently preferred embodiment, the voltage across resistor R83 may be equal to approximately 0.6 V and the current through resistor R83, and thus through transistor Q49, therefore remains constant at approximately 6 mA. This current is limited in this way so that the drive current to transistor Q57 remains constant over the full range of output voltage $V_{OUT}$.

Most of this current is drawn from the base electrodes of transistors Q57 and Q80, thereby causing them to turn on. When transistors Q57 and Q80 turn on, switch device Q53, Q31 is biased off by the application of the third source of voltage potential to the base electrodes of transistors Q53 and Q31. The voltage drops across transistors Q57 and Q80 while they are on are less than the turn-on voltages required by the base-emitter junctions of transistors Q53 and Q31, respectively. Transistors Q57 and Q80 hold transistors Q53 and Q31, respectively, in the off state while providing a low-resistance path through which charge stored in the base-collector junctions of transistors Q53 and Q31 is drained. Resistor R66 ensures an approximately equal division of current among transistors Q57 and Q80. This arrangement enables transistors Q53 and Q31 to turn off simultaneously, and thereby enables switch device Q53, Q31 to switch sufficiently quickly that differential voltage potential $V_{DIFF,Q24}$ remains greater in magnitude than reference voltage potential $V_{REF}$.

Figure 3:
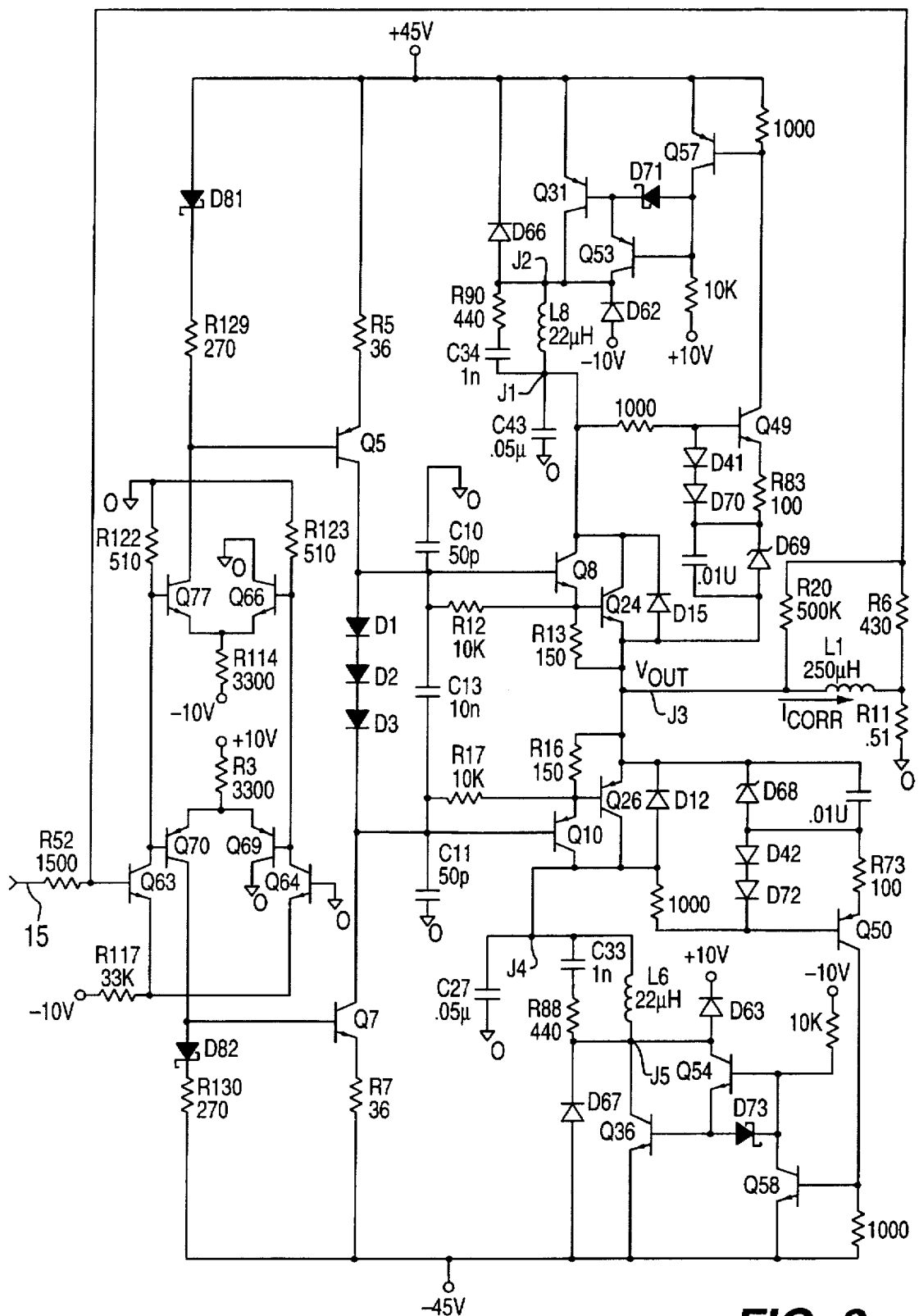
FIG. 3 is a schematic diagram of an alternative embodiment of the amplifier circuit shown in FIG. 1.

In an alternative embodiment for power amplifier 100, shown in FIG. 3, a Schottky diode D71 may be used in place of transistor Q80. When transistor Q57 turns on, switch device Q53, Q31 is biased off by the application of the third source of voltage potential to the base electrode of transistor Q53 and diode D71 becomes forward biased. The sum of the low forward voltage drop of diode D71 and the voltage drop across transistor Q57 while it is on is less than the turn-on voltage required by the base-emitter junction of transistor Q31. While applying the third source of voltage potential to the base electrode of transistor Q53 and to the base electrode of transistor Q31 through diode D71, transistor Q57 provides a low-impedance path from the base electrodes of transistors Q53 and Q31 to the third source of voltage potential, through which path charge stored in the base-collector junctions of transistors Q53 and Q31 is drained.

Referring again to FIG. 2, once switch device Q53, Q31 turns off, the flow of charging current through inductor L8 is interrupted. As a result, the polarity of the voltage at junction J2 will change rapidly from positive to negative. The snubber circuit comprising resistor R90 and capacitor C34 attenuates the amplitude of any voltage spike resulting from the discontinuity in current flow through inductor L8. Diode D66 prevents ringing at junction J2 by clamping junction J2 to the third source of voltage potential in the event that the voltage at that junction tries to exceed in magnitude the voltage of the third source of voltage potential.

Figure 4:
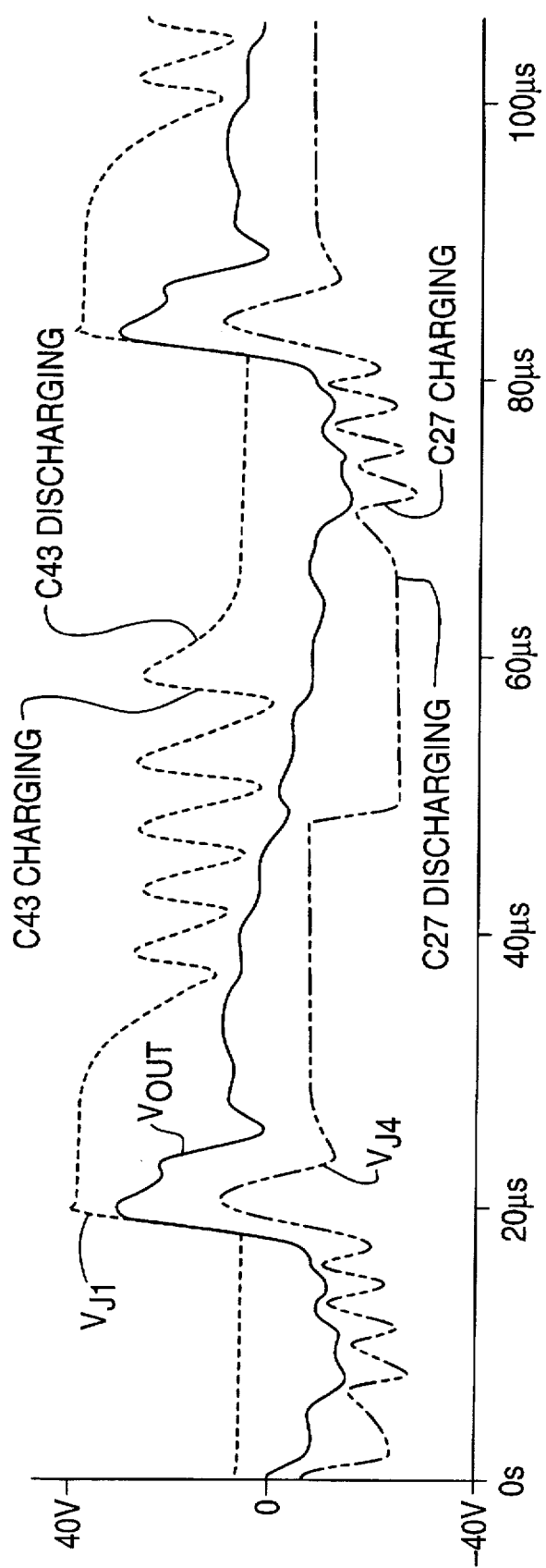
FIG. 4 shows particular voltage waveforms associated with the embodiments of FIGS. 2 and 3.

The change in polarity at junction J2 enables diode D62 to become forward biased and thereby conduct a current from the second source of voltage potential. This current flows into capacitor C43 through inductor L8, so that capacitor C43 is ultimately positively charged to a voltage that is equal in magnitude to approximately the sum of output voltage $V_{OUT}$, reference voltage $V_{REF}$ and an overshoot voltage which is dependent on the switching speed of switch device Q53, Q31. FIG. 4 shows a typical voltage waveform $V_{J1}$ for capacitor C43, at junction J1, in relation to output voltage $V_{OUT}$. A sawtooth portion of voltage waveform $V_{J1}$ indicates the charging and discharging of capacitor C43 as output device Q8, Q24 conducts convergence correction current $I_{CORR}$.

Referring again to FIG. 2, it is possible for capacitor C43 to supply convergence correction current $I_{CORR}$ to deflection coil L1 through transistor Q24 while a voltage at junction J3 has a negative polarity. This can occur because of the phase relationship between voltage and current waveforms in an inductance, namely, that a voltage leads a current in an inductance by 90°.

If the polarity of the voltage at junction J3 becomes negative while transistor Q24 is conducting convergence correction current $I_{CORR}$, a voltage at junction J3 will tend to become more negative in an attempt to maintain differential voltage potential $V_{DIFF,Q24}$ equal to reference voltage $V_{REF}$.

One skilled in the art can control the degree to which the voltage at junction J1 will track a such negative excursion at junction J3 by the choice of voltage level at the anode of diode D62. In a presently preferred embodiment, for example, the anode of diode D62 is coupled to the second source of voltage potential so that the voltage at junction J1 can drop as low as −10 V as it tracks the output voltage $V_{OUT}$ at junction J3. It was empirically determined for the presently preferred embodiment that the benefits of having the voltage at junction J1 track the output voltage $V_{OUT}$ were substantially reduced once the voltage at junction J1 exceeded in magnitude −10 V. Nonetheless, one skilled in the art might conclude that it is appropriate to couple the anode of diode D62 to a voltage level other than −10 V.

The response of power amplifier 100 to a positive-polarity component of convergence correction voltage waveform 15 is analogous to the response already delineated for the negative-polarity component. During a positive-polarity component, transistor Q63 becomes more conductive, so that the current flowing through resistor R122 increases. Since the current through resistor R117 remains constant, the current flowing through resistor R123 necessarily decreases by an amount that is equal and opposite to the increase in current through resistor R122.

Concurrently, transistors Q69 and Q77 become less conductive. The increased current flowing through resistor R122 causes a voltage at the base electrodes of transistors Q70 and Q77 to become more negative, thereby causing transistor Q77 to become less conductive. Similarly, the decreased current flowing through resistor R123 causes a voltage at the base electrodes of transistors Q66 and Q69 to become more positive, thereby causing transistor Q69 to become less conductive.

Transistors Q66 and Q70, on the other hand, become more conductive. As transistor Q70 becomes more conductive, it conducts more current into the base electrode of transistor Q7, thereby turning on transistor Q7 more fully. Simultaneously, as transistor Q66 becomes more conductive, transistor Q77 draws less current from the base electrode of transistor Q5, thereby turning off transistor Q5.

Resistors R7 and R130 are chosen such that transistor Q7 conducts a current that is approximately equal to twelve times the current conducted by transistor Q70. The low forward voltage drop of diode D82 allows transistor Q7 to be barely on while input stage 25 is in a balanced condition. Diode D82 also provides temperature compensation by tracking, over temperature, the emitter-to-base voltage drop of transistor Q7 in order to protect transistor Q7 from the effects of thermal runaway.

The current conducted by transistor Q7 drives output device Q10, Q26 of output stage 40. As output device Q10, Q26 begins to conduct, the convergence correction current $I_{CORR}$ flows from deflection coil L1 and into capacitor C27 through transistor Q26.

As capacitor C27 is charged by convergence correction current $I_{CORR}$, a voltage at junction J4 begins to rise. Once this voltage rises sufficiently that differential voltage potential $V_{DIFF,Q26}$ falls below reference voltage $V_{REF}$, diodes D42, D68 and D72 are reverse biased and transistors Q50 and Q58 are off. Switching regulator circuit 61 is thus free to negatively charge capacitor C27, thereby restoring differential voltage potential $V_{DIFF,Q26}$ to a voltage that is at least equal to reference voltage $V_{REF}$.

With transistor Q58 in the off state, switch device Q54, Q36 can turn on. Inductor L6 is coupled to the fourth source of voltage potential, −45 V, by transistor Q36. A negative charging current can thus begin to flow through transistor Q36. In order to avoid the current lag inherently associated with inductor L6, this current initially flows from capacitor C27 through the snubber circuit comprising resistor R88 and capacitor C33 until it can begin to flow from capacitor C27 directly through inductor L6.

Once the voltage at junction J4 reaches the point that differential voltage potential $V_{DIFF,Q26}$ is equal to reference voltage $V_{REF}$, diodes D42 and D72 become forward biased and voltage regulator D68 maintains an essentially constant voltage drop of approximately 7.5 V from its cathode to its anode. As a result, transistor Q50 turns on.

The current that flows through transistor Q50 is limited by diodes D42 and D72. The voltage across resistor R73 is equal to the voltage drop across diodes D42 and D72 less the voltage drop across the base-emitter junction of transistor Q50. Thus, in a presently preferred embodiment, the voltage across resistor R73 may be equal to approximately 0.6 V and the current through resistor R73, and thus through transistor Q50, therefore remains constant at approximately 6 mA. This current is limited in this way so that the drive current to transistor Q58 remains constant over the full range of output voltage $V_{OUT}$.

Most of this current flows into the base electrodes of transistors Q58 and Q81, thereby causing them to turn on. When transistors Q58 and Q81 turn on, switch device Q54, Q36 is biased off by the application of the fourth source of voltage potential to the base electrodes of transistors Q54 and Q36. The voltage drops across transistors Q58 and Q81 while they are on are less than the turn-on voltages required by the base-emitter junctions of transistors Q54 and Q36, respectively. Transistors Q58 and Q81 hold transistors Q54 and Q36, respectively, in the off state while providing a low-resistance path through which charge stored in the base-collector junctions of transistors Q54 and Q36 is drained. Resistor R72 ensures an approximately equal division of current among transistors Q58 and Q81. This arrangement enables transistors Q54 and Q36 to turn off simultaneously, and thereby enables switch device Q54, Q36 to switch sufficiently quickly that differential voltage potential $V_{DIFF,Q24}$ remains greater in magnitude than reference voltage potential $V_{REF}$.

In an alternative embodiment for power amplifier 100, shown in FIG. 3, a Schottky diode D73 may be used in place of transistor Q81. When transistor Q58 turns on, switch device Q54, Q36 is biased off by the application of the third source of voltage potential to the base electrode of transistor Q54 and diode D73 becomes forward biased. The sum of the low forward voltage drop of diode D73 and the voltage drop across transistor Q58 while it is on is less than the turn-on voltage required by the base-emitter junction of transistor Q36. While applying the third source of voltage potential to the base electrode of transistor Q54 and to the base electrode of transistor Q36 through diode D73, transistor Q58 provides a low-impedance path from the base electrodes of transistors Q54 and Q36 to the third source of voltage potential, through which path charge stored in the base-collector junctions of transistors Q54 and Q36 is drained.

Referring again to FIG. 2, once switch device Q54, Q36 turns off, the flow of negative charging current through inductor L6 is interrupted. As a result, the polarity of a voltage at junction J5 will change rapidly from negative to positive. The snubber circuit comprising resistor R88 and capacitor C33 attenuates the amplitude of any voltage spikes resulting from the discontinuity in current flow through inductor L6. Diode D67 prevents ringing at junction J5 by clamping junction J5 to the fourth source of voltage potential in the event that the voltage at that junction tries to exceed in magnitude the voltage of the fourth source of voltage potential.

The change in polarity at junction J5 enables diode D63 to become forward biased and thereby conduct a current into the first source of voltage potential. This current flows from capacitor C27 and through inductor L6, so that capacitor C27 is ultimately negatively charged to a voltage that is equal in magnitude to approximately the sum of output voltage $V_{OUT}$, reference voltage $V_{REF}$ and an overshoot voltage which is dependent on the switching speed of switch device Q54, Q36. FIG. 4 shows a typical voltage waveform $V_{J4}$ for capacitor C27, at junction J4, in relation to output voltage $V_{OUT}$. A sawtooth portion of voltage waveform $V_{J4}$ indicates the charging and discharging of capacitor C27 as output device Q10, Q26 conducts convergence correction current $I_{CORR}$.

Referring again to FIG. 2, it is possible that capacitor C27 could be sinking convergence correction current $I_{CORR}$ from deflection coil L1 through transistor Q26 while the voltage at junction J3 has a positive polarity. This can occur because of the phase relationship between voltage and current waveforms in an inductance, namely, that a voltage leads a current in an inductance by 90°.

If the polarity of the voltage at junction J3 does become positive while transistor Q26 conducts convergence correction current $I_{CORR}$, the voltage at junction J4 will tend to become more positive in an attempt to maintain differential voltage potential $V_{DIFF,Q26}$ equal to reference voltage $V_{REF}$.

One skilled in the art can control the degree to which the voltage at junction J4 will track a such positive excursion at junction J3 by the choice of voltage level at the cathode of diode D63. In a presently preferred embodiment, for example, the cathode of diode D63 is coupled to the first source of voltage potential so that the voltage at junction J4 can rise as high as +10 V as it tracks the output voltage $V_{OUT}$ at junction J3. It was empirically determined for the presently preferred embodiment that the benefits of having the voltage at junction J4 track the output voltage $V_{OUT}$ were substantially reduced once the voltage at junction J4 exceeded in magnitude +10 V. Nonetheless, one skilled in the art might conclude that it is appropriate to couple the cathode of diode D63 to a level other than +10 V.

Figure 5:
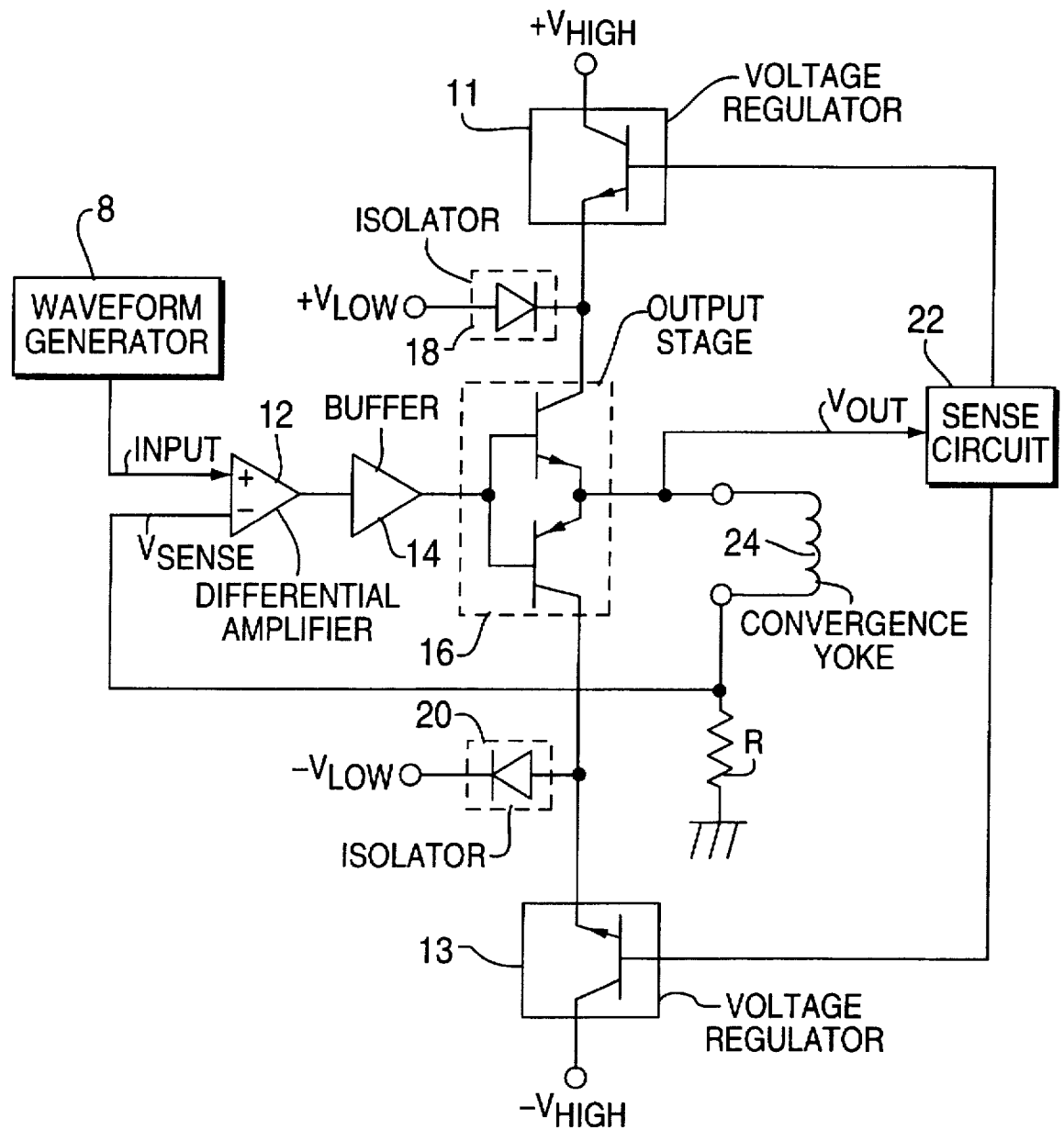
FIG. 5 is a diagram, in block and schematic form, of a prior art amplifier circuit.

Power amplifier 100 may use approximately one-half the power used by the prior art amplifier shown in FIG. 5. Several characteristics of power amplifier 100 are responsible for this. First, coupling the collector electrodes of transistors Q63 and Q64 to ground allows for low currents in the differential amplifier of input stage 25. Second, the common-mode current flowing in driver stage 30 is very low, approximately between 1 and 2 mA. Third, differential voltage potentials $V_{DIFF,Q24}$ and $V_{DIFF,Q26}$ track output voltage $V_{OUT}$, so that power dissipated by output devices Q8, Q24 and Q10, Q26 is kept to a minimum, consistent with circuit, signal and load requirements. Fourth, Schottky diodes are used in several places in power amplifier 100. The low forward voltage drop associated with Schottky diodes contributes to the low power dissipation of power amplifier 100. Finally, power dissipated by switching regulator circuits 60 and 61 is kept to a minimum because transistors Q31 and Q36, respectively, are fully on, and thus maintain a minimal voltage drop, while switching regulator circuits 60 and 61 charge capacitors C43 and C27, respectively.

Having described a presently preferred embodiment of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An amplifier circuit, comprising:
   a semiconductor output device for generating an output current for driving a load, said output device having first and second electrodes, said second electrode coupled to said load;
   means for comparing a differential voltage potential between said first and second electrodes with a predetermined voltage potential;
   a capacitor; and
   means for charging said capacitor responsive to said comparing means to maintain said differential voltage potential greater in magnitude than said predetermined voltage potential despite variations in a voltage at said second electrode of said output device;
   said comparing means causing said charging means to charge said capacitor when said differential voltage potential decreases in magnitude below said predetermined voltage potential, and said comparing means conducting a constant current regardless of variations in said voltage at said second electrode of said output device when said differential voltage potential is greater in magnitude than said predetermined voltage potential.

2. An amplifier circuit, comprising:
   a semiconductor output device for generating an output current for driving a load, said output device having first and second electrodes and a differential voltage potential therebetween, said second electrode being coupled to said load;
   means for comparing said differential voltage potential with a predetermined voltage potential;
   a capacitor;
   a switch device having a first electrode coupled to a first source of voltage potential, said switch device being responsive to said comparing means for charging said capacitor responsive to said comparing means in order to maintain said differential voltage potential between said first and second electrodes greater in magnitude than said predetermined voltage potential despite variations in a voltage at said second electrode of said output device;
   an inductor having a first terminal coupled to a second electrode of said switch device and a second terminal coupled to a first terminal of said capacitor; and,
   a diode coupled between said first terminal of said inductor and a second source of voltage potential, such that said diode becomes forward-biased when said switch device is rendered non-conductive.

3. The amplifier circuit of claim 2, wherein said switch device comprises first and second bipolar junction transistors arranged in a Darlington configuration.

4. The amplifier circuit of claim 3, wherein said first and second bipolar junction transistors turn off approximately simultaneously when said differential voltage potential is greater in magnitude than said predetermined voltage potential.

5. The amplifier circuit of claim 3, wherein a Schottky diode is coupled from a collector electrode of said first transistor to an emitter electrode of said second transistor.

6. An amplifier circuit, comprising:
   a semiconductor output device for generating an output current for driving a load;
   means for comparing a differential voltage potential between first and second electrodes of said output device with a predetermined voltage potential; and, a switched-mode voltage regulator coupled to said output device and responsive to said comparing means, said switched-mode voltage regulator comprising:

a switch device coupled to said comparing means; and an inductance coupled to said switch device.

7. The amplifier circuit of claim 6, comprising:

wherein said switched-mode voltage regulator maintains said differential voltage potential at a level which is greater in magnitude than said predetermined voltage potential despite variations in a voltage at said second electrode of said output device.

8. The amplifier circuit of claim 7, wherein said differential voltage potential comprises a sum of said predetermined voltage potential and an overshoot voltage, the magnitude of which is dependent on a speed with which said switched-mode voltage regulator is responsive to said comparing means.

9. The amplifier circuit of claim 7, wherein said switched-mode voltage regulator comprises a buck-topology regulator circuit.

10. The amplifier circuit of claim 9, wherein a switch device of said switched-mode voltage regulator switches at a frequency determined by said load.

11. The amplifier circuit of claim 10, wherein said comparing means causes said switch device to discontinue conducting when said differential voltage potential equals or exceeds in magnitude said predetermined voltage potential.

12. The amplifier circuit of claim 2, wherein said differential voltage potential comprises a sum of said predetermined voltage potential and an overshoot voltage, the magnitude of which is dependent upon a switching speed of said switch device.

* * * * *